(12) United States Patent
Miyamoto (10) Patent No.: US 7,076,754 B2
(45) Date of Patent: Jul. 11, 2006

(54) FUNCTIONAL BLOCK DESIGN METHOD AND APPARATUS

(75) Inventor: Tetsuo Miyamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 186 days.

(21) Appl. No.: 10/635,499

(22) Filed: Aug. 7, 2003

(65) Prior Publication Data

US 2004/0044969 A1    Mar. 4, 2004

(30) Foreign Application Priority Data

Aug. 28, 2002  (JP) .............. 2002-248439

(51) Int. Cl.
*G06F 17/50*    (2006.01)
*G06F 9/45*    (2006.01)

(52) U.S. Cl. .............................. 716/8; 6/10

(58) Field of Classification Search ............ 716/1–18
See application file for complete search history.

(56) References Cited

U.S. PATENT DOCUMENTS

| 6,029,236  | A  * | 2/2000  | Steele et al. ............... 711/170 |
| 6,553,552  | B1 * | 4/2003  | Khan et al. ................ 716/10 |
| 6,593,772  | B1 * | 7/2003  | Ngai et al. ................. 326/40 |
| 6,631,440  | B1 * | 10/2003 | Jenne et al. ............... 711/105 |
| 6,787,859  | B1 * | 9/2004  | Itou et al. ................. 257/390 |
| 2002/0095560 | A1 * | 7/2002  | Barth et al. ............... 711/169 |
| 2003/0204676 | A1 * | 10/2003 | Hotta et al. ............... 711/137 |

OTHER PUBLICATIONS

Abstract of Japanese Publication No. 63-081569 A dated Abstract Apr. 12, 1988.

* cited by examiner

Primary Examiner—Vuthe Siek
Assistant Examiner—Nghia M. Doan
(74) Attorney, Agent, or Firm—Staas & Halsey LLP (57) ABSTRACT

A functional block design method capable of shortening the period needed for developing functional blocks in compliance with orders. A logic design is prepared for a desired number of memory floor plan blocks with respective predetermined data storage capacities and a fixed block different from the memory floor plan blocks, and block-based design data is created in compliance with the logic design. The created block-based design data is verified in that a constraint on the creation of a CPU macro is always fulfilled within the limits up to which the memory blocks can be mounted. Using the verified block-based design data, design data of a CPU macro functional block in which a desired number of memory blocks corresponding to a desired memory capacity are connected to the fixed block is generated.

16 Claims, 9 Drawing Sheets

FUNCTIONAL BLOCK DESIGN METHOD AND APPARATUS

CROSS-REFERENCE TO RELATED APPLICATIONS

This application is based upon and claims the benefits of priority from the prior Japanese Patent Application No. 2002-248439, filed on Aug. 28, 2002, the entire contents of which are incorporated herein by reference.

BACKGROUND OF THE INVENTION (1) Field of the Invention

The present invention relates to a functional block design method for designing a functional block including memory and a functional block design apparatus for carrying out the method, and more particularly, to a functional block design method for designing a functional block incorporating therein memory with a desired capacity complying with an order and a functional block design apparatus for carrying out the method.

(2) Description of the Related Art

Nowadays various electronic devices are controlled by LSI (Large Scale Integrated) control units (system LSIs) incorporated therein. In recent years, there has been an increasing demand for curtailment of the period needed for the development of such electronic devices so that the devices can be promptly placed on the market. Thus, also in the case of system LSIs incorporated in electronic devices, there has been a demand for shorter-period development of optimum system LSIs with high functionality.

Techniques for developing a system LSI in a short period of time include a method wherein circuit design and verification of operation are carried out for each function of the system LSI. A circuit block (functional block) associated with each function is called macro, and macros required to control an electronic device are combined to develop a system LSI necessary for the electronic device.

Among the macros constituting a system LSI, a macro including a CPU (Central Processing Unit) core circuit is referred to as CPU macro. A macro including a DSP (Digital Signal Processor) also comes under the concept of CPU macro.

The CPU macro includes a peripheral circuit, a memory circuit, etc. besides the CPU core circuit. By having a memory circuit built into the CPU macro, it is possible to verify, within the CPU core circuit, the operation of a basic process (e.g., a process requiring high-speed execution) executed by the CPU core circuit.

Meanwhile, the memory configuration (e.g., capacities of ROM (Read Only Memory) and RAM (Random Access Memory)) of the CPU macro is determined in accordance with the electronic device as an end product. Accordingly, the floor plan of the CPU macro needs to be determined for each product in which the system LSI is to be incorporated. Thus, in order to speed up the development of system LSI, curtailment of the period needed for designing the floor plan of the CPU macro is also demanded.

Figure 8A:
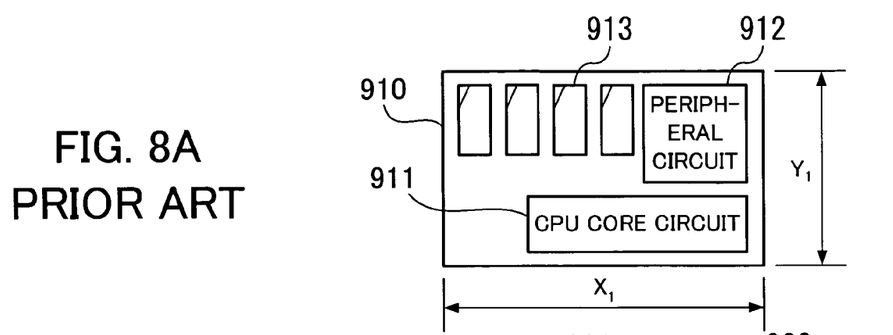
FIG. 8A shows a first example of floor plan.
Figure 8B:
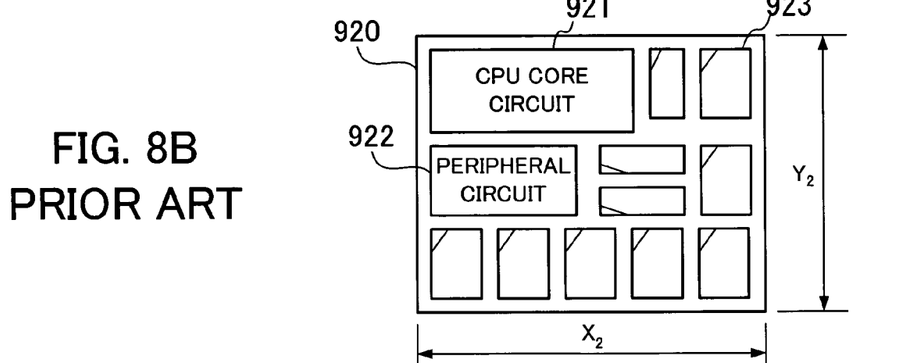
FIG. 8B shows a second example of floor plan.
Figure 8C:
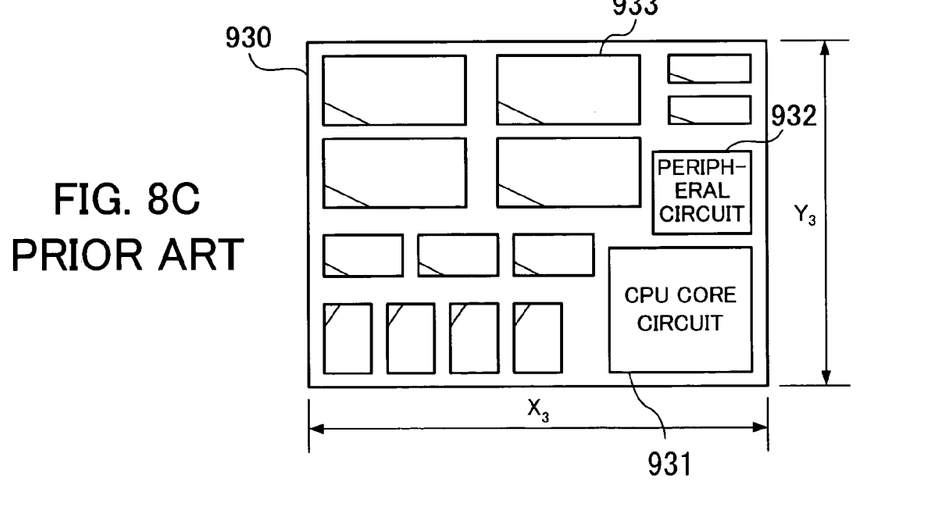
FIG. 8C shows a third example of floor plan.

FIGS. 8A to 8C illustrate conventional floor plans for CPU macros, wherein FIG. 8A shows a first example of floor plan, FIG. 8B shows a second example of floor plan, and FIG. 5C shows a third example of floor plan.

In the case of developing CPU macros, the required memory size/memory configuration varies from product to product, as shown in FIGS. 8A to 8C. Accordingly, the arrangement of the CPU core circuit, peripheral circuit, memory circuit, etc. is determined for individual products. The floor plan is so designed that the CPU macro as a whole may have an aspect ratio (vertical dimension-to-lateral dimension ratio) falling within a predetermined range. This is because the closer to square the aspect ratio is, the more easily an LSI chip can be designed during the development of the whole chip.

For example, in the floor plan shown in FIG. 8A, a CPU macro 910 has a CPU core circuit 911, a peripheral circuit 912 and a plurality of memory circuits 913 arranged therein. The CPU macro 910 is in the form of a rectangle having lateral sides with a length of $X_1$ and vertical sides with a length of $Y_1$, hence the aspect ratio (vertical dimension-to-lateral dimension ratio) being $Y_1/X_1$. This CPU macro 910 has a small memory capacity, compared with the other exemplary floor plans.

In the floor plan of FIG. 8B, a CPU macro 920 has a CPU core circuit 921, a peripheral circuit 922 and a plurality of memory circuits 923 arranged therein. The CPU macro 920 has lateral sides with a length of $X_2$ and vertical sides with a length of $Y_2$, and hence the aspect ratio is $Y_2/X_2$. The memory capacity of the CPU macro 920 is greater than that of the first example of floor plan but smaller than that of the third example of floor plan.

In the floor plan of FIG. 8C, a CPU macro 930 has a CPU core circuit 931, a peripheral circuit 932 and a plurality of memory circuits 933 arranged therein. The CPU macro 930 has lateral sides with a length of $X_3$ and vertical sides with a length of $Y_3$, and hence the aspect ratio is $Y_3/X_3$. This CPU macro 930 has a large memory capacity, compared with the other exemplary floor plans.

Thus, in the case of CPU macros designed in compliance with orders, the memory configuration/memory capacity varies even if the logical structure of the CPU core circuit and peripheral circuit is the same. Conventionally, therefore, floor planning is carried out for each CPU macro by determining the arrangement of the individual circuits so that the aspect ratio may fall within a certain range. Namely, even if the change made to the configuration of a CPU macro designed in the past involves memory capacity only, it is necessary that the CPU core circuit, the peripheral circuit and the memory circuits should individually be rearranged.

Also, in cases where a floor plan is newly prepared, the step of guaranteeing a certain operating frequency needs to be executed.

Figure 9:
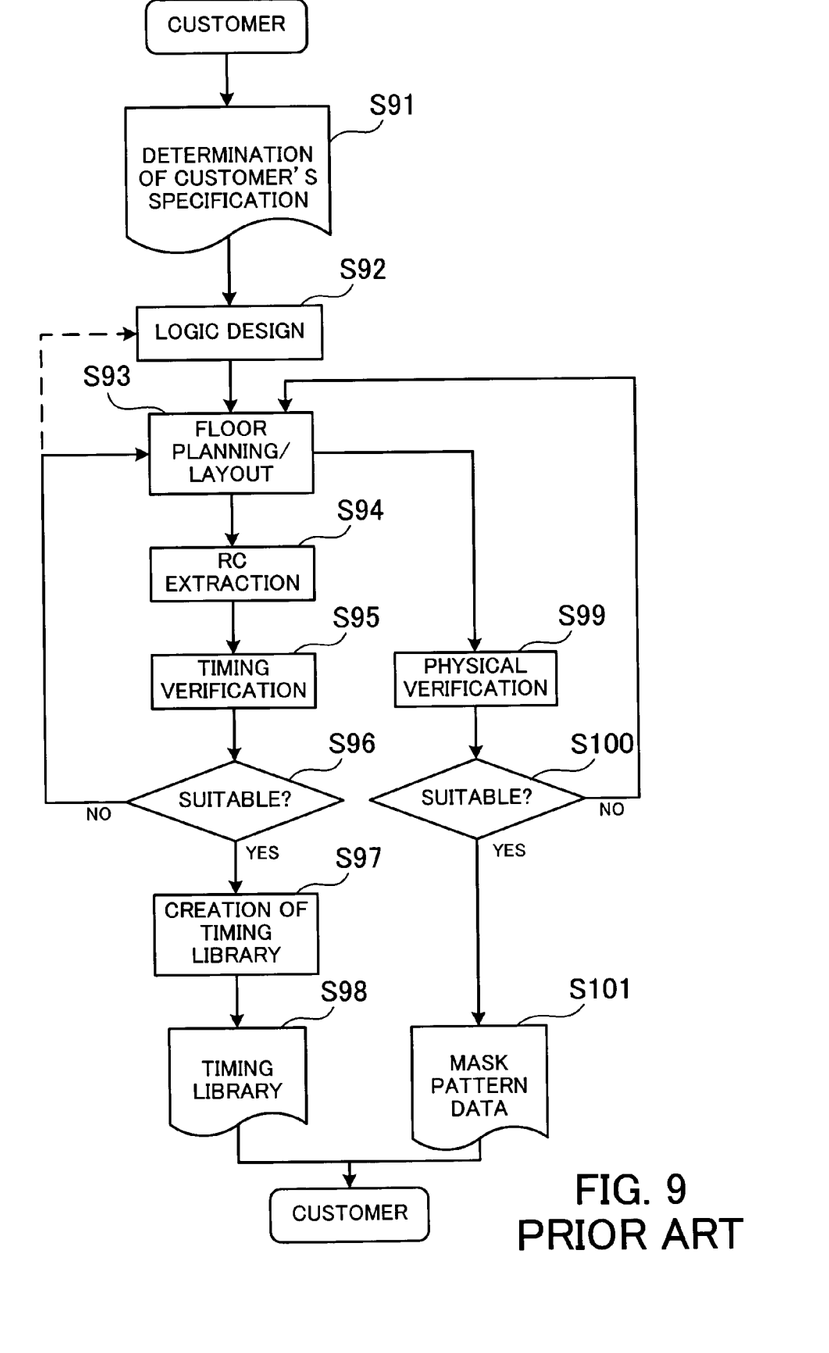
FIG. 9 is a flowchart illustrating a procedure for designing a CPU macro.

FIG. 9 illustrates a procedure for designing a CPU macro. First, the customer's specification is determined (Step S91), and then a logic design is prepared in compliance with the customer's specification (Step S92). After the logic design is completed, a floor plan/layout is determined (Step S93). Specifically, a CPU core circuit, a peripheral circuit and a plurality of memory circuits are arranged so that the aspect ratio may be within a predetermined range.

After the floor planning/layout is completed, the process separates into a timing verification procedure (Steps S94 to S98) and a physical verification procedure (Steps S99 to S101).

In the timing verification procedure (Steps S94 to S98), first, an RC extraction process is carried out (Step S94). In this step, a delay is calculated from the resistance (R) and electrostatic capacitance (C) of a plurality of sections in the circuit. Then, based on the extracted RC, timing verification is carried out (Step S95). Namely, it is verified whether signal is transmitted with correct timing as demanded by the logic design. The result of the verification is then checked (Step S96).

If the result of the verification is unsuitable, the CPU macro is again designed from the logic design (Step S92) or from the floor planning/layout (Step S93). Generally, in cases where the result of verification is unsuitable in initial stages, the floor planning/layout (Step S93) is carried out again. If the result of the timing verification becomes unsuitable even though the floor planning/layout (Step S93) is modified a plurality of times, then the logic design (Step S92) is prepared again.

If the result of the verification is suitable, a timing library is created (Step S97). The timing library has registered therein information about the propagation (delay etc.) of signal between the component elements (e.g., flip-flops).

In the physical verification procedure, first, physical verification is carried out (Step S99). As such physical verification, it is verified whether the physical arrangement such as a wiring pitch, for example, satisfies a condition specified by a predetermined rule. The result of the verification is then checked (Step S100).

If the result of the physical verification is unsuitable, the layout decision process of Step S93 is again performed.

If the result of the physical verification is OK, floor plan data and mask pattern data are generated (Step S101). The floor plan data is data indicating, for example, the positions of terminals provided to connect the CPU macro to other circuits. The mask pattern data is data indicating a mask pattern for the CPU macro. Subsequently, the generated timing library, floor plan data and mask pattern data are delivered to the customer.

In this manner, the configuration of the CPU macro whose operation at a certain operating frequency is guaranteed is determined.

Each time a floor plan is prepared anew, however, the timing verification and the physical verification need to be carried out to guarantee the operating frequency, and the floor planning/layout planning must be repeated until these verifications are established. If the floor plan/layout plan is modified, the timing and physical verifications must be again carried out, with the result that much time is needed for the development of CPU macros.

SUMMARY OF THE INVENTION

The present invention was created in view of the above circumstances, and an object thereof is to provide functional block design method and apparatus capable of shortening the period needed for the development of a functional block complying with an order.

To achieve the object, there is provided a functional block design method for designing a functional block including a memory. The functional block design method comprises creating block-based design data associated with each of a memory block with a predetermined data storage capacity and a fixed block different from the memory block, in accordance with a predetermined logic design, verifying with respect to the created block-based design data that a constraint on creation of the functional block is always fulfilled within limits up to which the memory blocks can be mounted, and generating, with use of the verified block-based design data, design data of a functional block in which a desired number of the memory blocks corresponding to a desired memory capacity are connected to the fixed block.

Also, to achieve the above object, there is provided a functional block design apparatus for automatically designing a functional block including a memory. The functional block design apparatus comprises a storage device for storing block-based design data associated with each of a memory block and a fixed block different from the memory block, the block-based design data being verified in that a constraint on creation of the functional block is always fulfilled within limits up to which the memory blocks can be mounted, and an arithmetic unit, responsive to an input specifying a memory capacity, for generating, with use of the block-based design data stored in the storage device, design data of a functional block in which a desired number of the memory blocks corresponding to the specified memory capacity are connected to the fixed block.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 8A, 8B and 8C are diagrams showing conventional floor plans for CPU macros, wherein

DESCRIPTION OF THE PREFERRED EMBODIMENTS

Embodiments of the present invention will be hereinafter described with reference to the drawings.

First, the invention applied to the embodiments will be outlined, and then the embodiments will be described in detail. In the following description of the embodiments, a floor plan is designed for a CPU macro as an example of a functional block including a memory. Also, in the following, a memory block is referred to as memory floor plan block.

Figure 1:
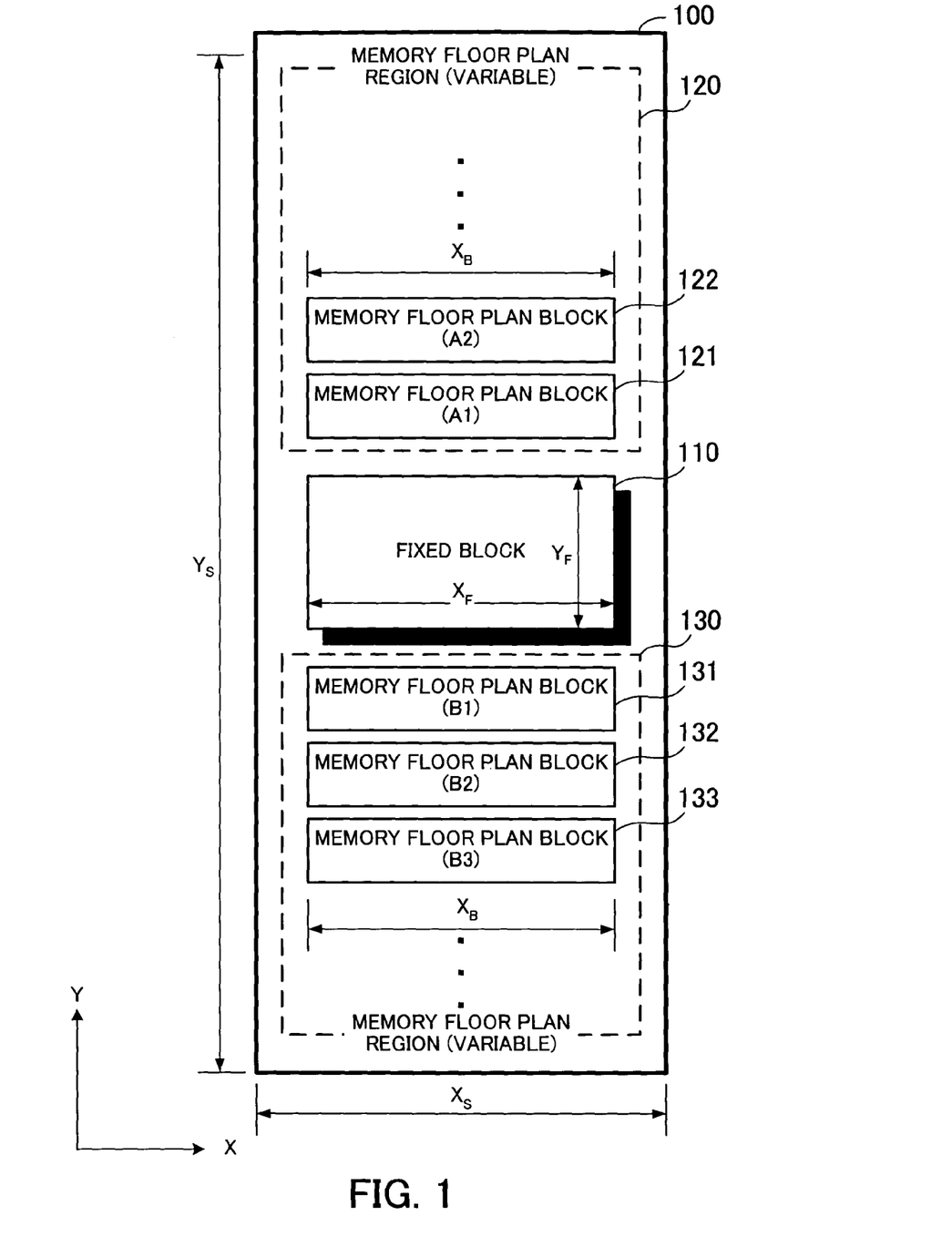
FIG. 1 is a conceptual diagram illustrating the invention applied to embodiments.

FIG. 1 is a conceptual diagram illustrating the invention applied to the embodiments, wherein X and Y axes are taken along the lateral direction and the vertical direction, respectively.

As a first step, the floor plan of a CPU macro 100 is divided into a region in which a fixed block 110 requiring no change is arranged, and memory floor plan regions 120 and 130 (variable memory capacity regions) in which are arranged memories whose configuration varies from customer to customer. The fixed block 110 includes a CPU core circuit and a peripheral circuit. The memory floor plan region 120 is located on an upper side of the fixed block 110 as viewed in FIG. 1, while the other memory floor plan region 130 is located on a lower side of the fixed block 110.

Although in the example shown in FIG. 1, the memory floor plan regions 120 and 130 are situated on the upper and lower sides of the fixed block 110, respectively, the regions 120 and 130 may alternatively be located on the left and right sides, respectively, of the fixed block 110. In this case, the vertical direction (Y-axis direction) and lateral direction (X-axis direction) appearing in the following description should be read vice versa.

As a second step, the shapes of the individual blocks are determined so that the aspect ratio (vertical dimension-to-lateral dimension ratio) of the CPU macro 100 may always fall within a predetermined range when a desired number of memory floor plan blocks 121, 122, . . . , 131, 132, 133, . . . are connected in compliance with a predetermined connection rule within the limits up to which the memory floor plan blocks can be mounted.

In the example of FIG. 1, the predetermined connection rule requires that the memory floor plan blocks 121, 122, . . . , 131, 132, 133, . . . should be concatenated in a direction intersecting with (e.g., in the vertical direction perpendicular to) the adjacent sides (sides with a length of $X_F$) of the fixed block 110 and memory floor plan blocks 121, 122, . . . , 131, 132, 133, . . . .

Also, in the example of FIG. 1, the fixed block 110 and the memory floor plan blocks 121, 122, . . . , 131, 132, 133, . . . are each in the form of a rectangle. Accordingly, the shapes of the individual blocks are determined as soon as the lengths of the vertical and lateral sides of the individual blocks are settled.

Thus, $Y_F$ and $X_F$ of the fixed region are determined so that $Y_S/X_S$, which is the aspect ratio (vertical dimension-to-lateral dimension ratio) of the CPU macro 100, may fall within a predetermined range with respect to maximum and minimum memory areas determined in compliance with the specification of the CPU macro 100. In the illustrated example, $Y_S$ denotes the length of the CPU macro 100 in the vertical direction, and the $X_S$ denotes the length of the CPU macro 100 in the lateral direction. Also, $Y_F$ denotes the length of the fixed block 110 in the vertical direction, and the $X_F$ denotes the length of the fixed block 110 in the lateral direction. The value $X_F$ is smaller than $X_S$ by an amount corresponding to marginal spaces provided at both edges of the CPU macro 100.

Specifically, $Y_F/X_F$ satisfying the following two conditions is obtained. The first condition is that, for a minimum memory configuration ($Y_S$ is at a minimum), $Y_S/X_S$ should be greater than or equal to the minimum value of the aspect ratio. The second condition is that, for a maximum memory configuration ($Y_S$ is at a maximum), $Y_S/X_S$ should be smaller than or equal to the maximum value of the aspect ratio.

The areas of the memory floor plan regions 120 and 130 are determined based on the maximum memory capacity. Namely, the memory floor plan regions 120 and 130 have a total area large enough to accommodate the number of memory floor plan blocks corresponding to the maximum memory capacity to be packaged in the CPU macro 100. The maximum memory capacity may be set to the size of memory space accessible from the CPU core circuit.

Also, the size of memory floor plan block varies depending on the memory type. For example, RAM occupies a larger area than ROM. In this case, the total area of the memory floor plan regions 120 and 130 is at the maximum when the largest possible number of RAMs are packaged. The orderable maximum memory capacity may be determined as desired insofar as the size of the memory space is not exceeded.

As a third step, the length of one side of each memory floor plan block is determined so that $X_B$ may be almost equal to $X_F$ determined in the second step. Then, in compliance with a predetermined logic design, design data (block-based design data) associated with each of memory blocks with predetermined data storage capacities and the fixed block is created.

As a fourth step, the created block-based design data is verified in that a constraint on the creation of the CPU macro 100 is always fulfilled within the limits up to which the memory floor plan blocks 121, 122, . . . , 131, 132, 133, . . . can be mounted. In this case, if it is ascertained that a memory configuration with respect to which the constraint is tightest satisfies the constraint, then it may be judged that the constraint is always fulfilled. The constraint may, for example, be a timing assurance that the signal delay does not exceed a prescribed value. Such timing assurance serves to verify that signal is transmitted correctly in synchronism with the intended operating frequency.

Specifically, timing is assured with respect to memory configurations which show the largest and smallest delay values along paths from the data output terminals of the memory floor plan blocks arranged above and below the fixed block 110 to the data output terminals of the CPU macro 100. The memory configuration with the largest delay value is a configuration in which the memory floor plan blocks are packaged to the maximum in the memory floor plan regions 120 and 130. The memory configuration with the smallest delay value is a configuration in which the memory floor plan blocks packaged in the memory floor plan regions 120 and 130 are at the minimum. If it is evident from the design of the CPU core circuit that no problem arises in cases where the delay value is small, the timing assurance for the memory configuration with the smallest delay value may be omitted.

As a fifth step, design data of the CPU macro 100 in which a required number of memory floor plan blocks 121, 122, . . . , 131, 132, 133, . . . corresponding to a desired memory capacity are connected to the fixed block 110 is created by using the verified block-based design data.

Specifically, a suitable number of memory floor plan blocks 121, 122, . . . , 131, 132, 133, . . . corresponding to the memory configuration ordered from the customer are arranged in the memory floor plan regions 120 and 130. In this case, the memory floor plan blocks 121, 122, . . . , 131, 132, 133, . . . are placed in sequence from the position nearest to the fixed block 110. For example, the memory floor plan blocks are positioned alternately in the upper and lower memory floor plan regions 120 and 130 in the order: memory floor plan block 121→memory floor plan block 131→memory floor plan block 122→memory floor plan block 132→ . . . .

In this manner, a required number of memory floor plan blocks that meets an order from the customer are arranged, whereby design data of a CPU macro having the ordered memory capacity can be created.

A process for creating a floor plan of a CPU macro to order will be now described in detail.

Figure 2:
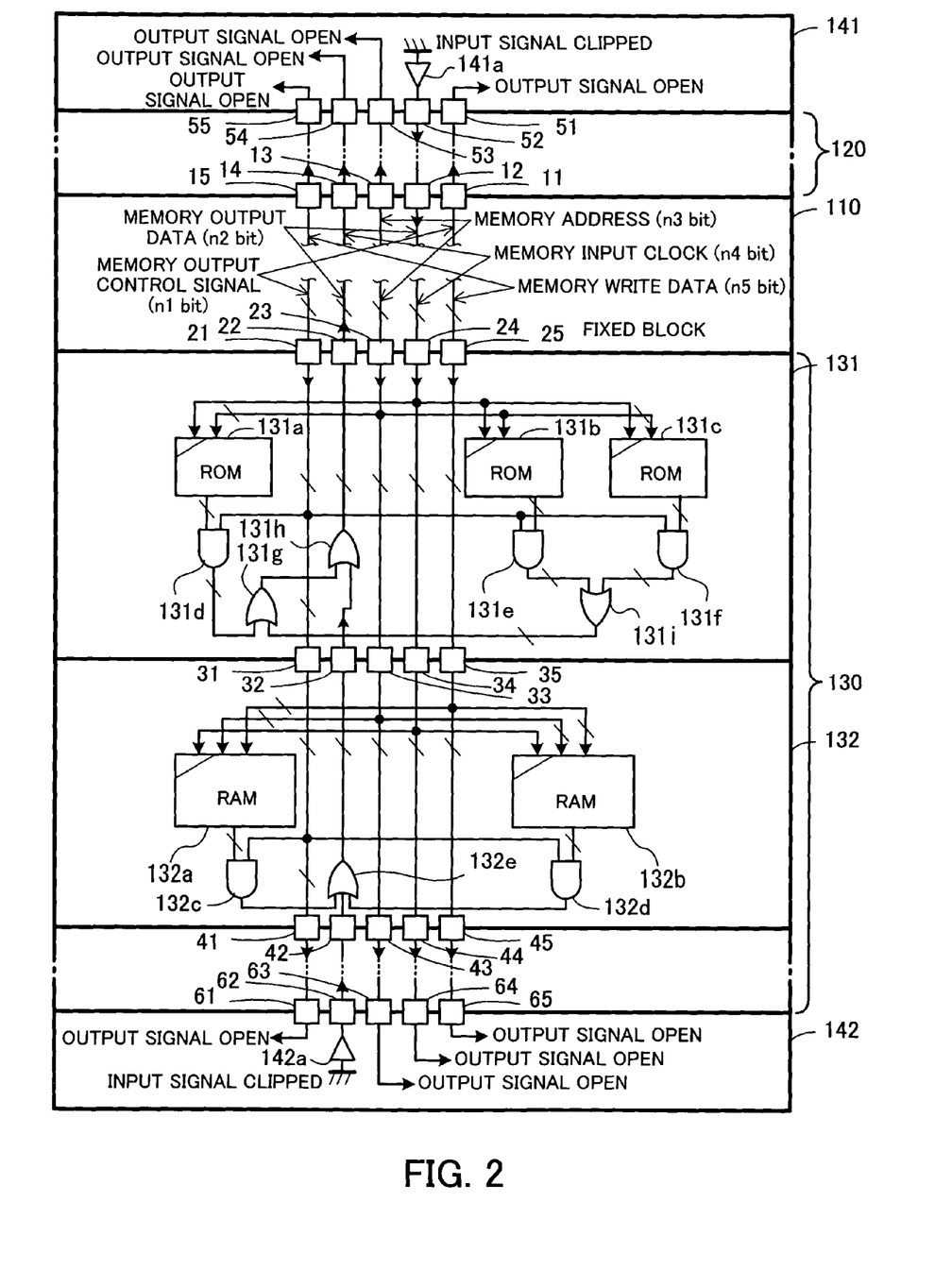
FIG. 2 is a diagram illustrating an exemplary structure of design data.

FIG. 2 illustrates an exemplary design data structure. In the example shown in FIG. 2, a clip module block 141 is additionally provided above the memory floor plan region 120 which is located above the fixed block 110. Similarly, another clip module block 142 is provided below the memory floor plan region 130 which is located below the fixed block 110. The clip module blocks 141 and 142 are floor plan blocks from which fixed signals are input to predetermined ones of input/output terminals of the memory floor plan blocks 131, 132, . . . within the memory floor plan regions 120 and 130, respectively.

The individual floor plan blocks are connected to each other via input/output terminals 11 to 15, 21 to 25, 31 to 35, 41 to 45, 51 to 55, and 61 to 65. The input/output terminals 11 to 15 connect the fixed block 110 to the memory floor plan block (not shown) in the memory floor plan region 120. The input/output terminals 21 to 25 connect the fixed block 110 to the memory floor plan block 131 in the memory floor plan region 130. The input/output terminals 31 to 35 connect the memory floor plan block 131 to the memory floor plan block 132, and the input/output terminals 41 to 45 connect the memory floor plan block 131 to another memory floor plan block (not shown) in the memory floor plan region 130. The input/output terminals 51 to 55 connect the memory floor plan block (not shown) in the memory floor plan region 120 to the clip module block 141, and the input/output terminals 61 to 65 connect the memory floor plan block (not shown) in the memory floor plan region 130 to the clip module block 142.

The fixed block 110 includes a CPU core circuit and a peripheral circuit, and five types of signal are input to and output from the fixed block. An n1-bit memory output control signal is transferred between the individual floor plan blocks via the input/output terminals 11, 21, 31, 41, 51 and 61, and n2-bit memory output data is transferred between the individual floor plan blocks via the input/output terminals 12, 22, 32, 42, 52 and 62. An n3-bit memory address is transferred between the individual floor plan blocks via the input/output terminals 13, 23, 33, 43, 53 and 63, an n4-bit memory input clock signal is transferred between the individual floor plan blocks via the input/output terminals 14, 24, 34, 44, 54 and 64, and n5-bit memory write data is transferred between the individual floor plan blocks via the input/output terminals 15, 25, 35, 45, 55 and 65. Each of n1, n2, n3, n4 and n5 represents an integer greater than or equal to "1."

In the example of FIG. 2, the memory floor plan block 131 is a floor plan block for ROM, and the memory floor plan block 132 is a floor plan block for RAM.

The memory floor plan block 131 for ROM is constituted by ROM circuits 131a to 131c, AND (logical product) gates 131d to 131f, and OR (logical sum) gates 131g to 131i. Data can be previously stored in the ROM circuits 131a to 131c and can be read out as needed.

The ROM circuits 131a to 131c are each input with the memory address and the memory input clock signal through the input/output terminals 23 and 24, respectively. The output of the ROM circuit 131a is input to the AND gate 131d. The output of the ROM circuit 131b is input to the AND gate 131e, and the output of the ROM circuit 131c is input to the AND gate 131f. Each of the AND gates 131d to 131f is also input with the memory output control signal through the input/output terminal 21.

The output of the AND gate 131d is input to the OR gate 131g. The outputs of the AND gates 131e and 131f are input to the OR gate 131i, of which the output is input to the OR gate 131g. The output of the OR gate 131g is input to the OR gate 131h, which is input also with the memory output data through the input/output terminal 32. The output of the OR gate 131h is supplied through the input/output terminal 22 to the fixed block 110 as the memory output data. The memory write data, which is input from the input/output terminal 25, is output to the memory floor plan block 132 for RAM through the input/output terminal 35.

The memory floor plan block 132 for RAM is constituted by RAM circuits 132a and 132b, AND gates 132c and 132d, and an OR gate 132e. The RAM circuits 132a and 132b permit data to be written therein as needed and also permit the data written therein to be read out as needed.

The RAM circuits 132a and 132b are each input with the memory address, memory input clock signal and memory write data through the input/output terminals 33, 34 and 35, respectively. The output of the RAM circuit 132a is input to the AND gate 132c, while the output of the RAM circuit 132b is input to the AND gate 132d. The AND gates 132c and 132d are input also with the memory output control signal through the input/output terminal 31.

The outputs of the AND gates 132c and 132d are input to the OR gate 132e, which is also input with the memory output data from the input/output terminal 42. The output of the OR gate 132e is supplied through the input/output terminal 32 to the memory floor plan block 131 as the memory output data.

The memory floor plan blocks in the memory floor plan region 120 are configured in the same manner as the memory floor plan blocks 131 and 132 in the memory floor plan region 130 but are rotated by 180 degrees.

In the clip module block 141, a ground-level (low-level) signal is supplied to the input/output terminal 52 through a buffer circuit 141a. Signals supplied to the clip module block 141 from the other input/output terminals 51, 53, 54 and 55 are open.

Also, in the clip module block 142, a ground-level signal is supplied to the input/output terminal 62 through a buffer circuit 142a. Signals supplied to the clip module block 142 from the other input/output terminals 61, 63, 64 and 65 are open.

With the floor plan blocks configured as described above, the memory output control signal, memory address, memory input clock signal and memory write data output from the fixed block 110 are supplied to the individual memory floor plan blocks 131, 132, . . . . Also, the memory output data output from the individual memory floor plan blocks 131, 132, . . . is supplied to the fixed block 110.

In the case where data is read from the ROM circuit 131a, for example, the memory address assigned to the ROM circuit 131a is output from the fixed block 110. The memory address thus output is input to the memory floor plan block 131 through the input/output terminal 23. Each of the ROM circuits 131a, 131b and 131c admits the memory address in synchronism with the memory input clock signal supplied from the fixed block 110.

Thereupon, the ROM circuit 131a fetches data from its storage region corresponding to the input memory address and outputs the data to the AND gate 131d. When the memory output control signal is asserted, the AND gate 131d outputs the data input thereto. The data output from the AND gate 131d is transferred to the fixed block 110 through the OR gates 131g and 131h and the input/output terminal 22.

In this manner, data in the memory floor plan blocks can be read out by the CPU core circuit in the fixed block 110.

In the case where data is written into the RAM circuit 132a, for example, the memory address assigned to the RAM circuit 132a as well as memory write data are output from the fixed block 110. The memory address and memory write data thus output are input to the memory floor plan block 132 through the input/output terminals 33 and 35, respectively. Each of the RAM circuits 132a and 132b admits the memory address in synchronism with the memory input clock signal supplied from the fixed block 110. Thereupon, the RAM circuit 132a writes the data into its storage region corresponding to the input memory address.

In this manner, data output from the CPU core circuit in the fixed block 110 can be written into the memory floor plan blocks.

In the design data illustrated in FIG. 2, the inputs of signals supplied to the fixed block 110 are fixed at low level (ground level), by way of input signal clipping, in the clip module blocks 141 and 142. This prevents the input signals to the memory floor plan blocks from becoming unstable.

Further, in this embodiment, each memory floor plan block is provided with input/output terminals at both upper and lower sides thereof, and the upper and lower input/output terminals are in one-to-one correspondence so that signals of the same types may be input to and output from the corresponding input/output terminals. Thus, when memory floor plan blocks are connected above and below, the input/output terminals associated with the same types of signals coincide in position. Consequently, a desired number of memory floor plan blocks can be concatenated.

Moreover, the memory floor plan block for ROM is provided with a signal line which allows RAM memory write data to pass therethrough. It is therefore possible to connect memory floor plan blocks for ROM and RAM in a manner such that they are mixed in desired arrangement.

As for the design data associated with each floor plan block, floor plan data, for example, may be created in a data format such as LEF (Library Exchange Format) or DEF (Design Exchange Format), and mask pattern data may be created in the GDS data format.

Also, the memory floor plan blocks can be arranged so as to provide a desired memory capacity complying with an order from the customer. The memory capacity (bit, word, column) per memory floor plan block and the memory type (ROM, RAM, etc.) can also be set as desired.

A procedure for a process for creating a floor plan of a CPU macro to order will be now described in detail. The CPU macro floor plan creation process can be divided roughly into a design data creation process (first through fourth steps explained above), which is executed beforehand independent of an order from the customer, and an order-matching floor plan creation process (fifth step).

Figure 3:
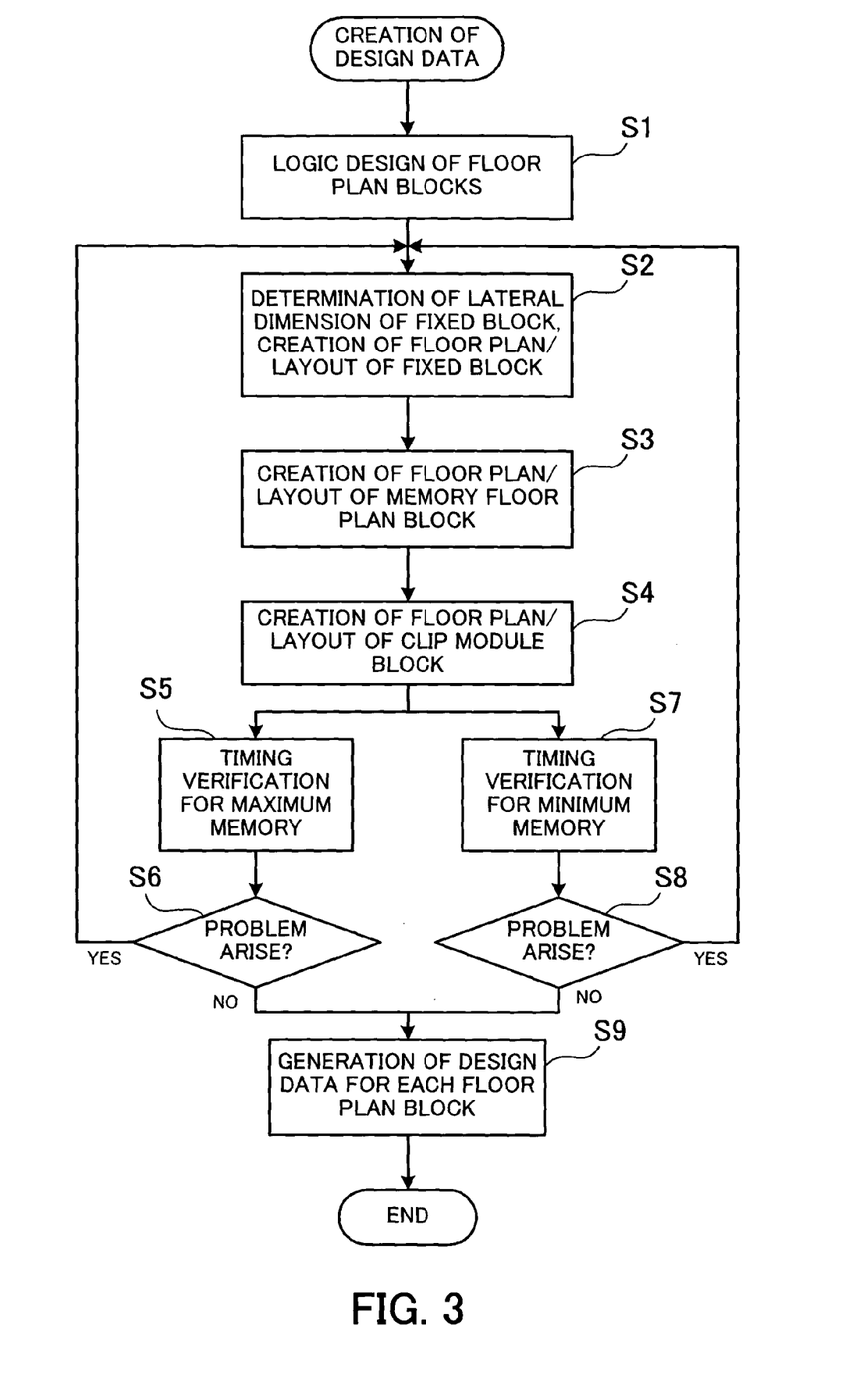
FIG. 3 is a flowchart illustrating a procedure for a design data creation process.

FIG. 3 illustrates a procedure for the design data creation process. In the following, the process shown in FIG. 3 will be explained in order of step number.

[Step S1] A logic design of individual floor plan blocks is prepared. For example, using software installed in a computer, a designer prepares a logic design of individual floor plan blocks and stores the contents of the logic design in the computer.

[Step S2] A floor plan/layout of the fixed block is created. Specifically, the lateral dimension (length in the X-axis direction) of the fixed block is determined so that the aspect ratio of the CPU macro may fall within a predetermined range when the memory floor plan regions have a maximum area (maximum memory) and also when the memory floor plan regions have a minimum area (minimum memory). Then, circuit wiring and the like are designed such that the CPU core circuit and the peripheral circuit are contained in a region with the determined lateral dimension. At this time, physical verification of the floor plan/layout of the fixed block is carried out, to thereby create a floor plan/layout that fulfills predetermined rules such as wiring pitch.

[Step S3] A floor plan/layout of the memory floor plan block is created. At this time, physical verification of the floor plan/layout of the memory floor plan block is carried out, to thereby create a floor plan/layout that fulfills predetermined rules such as wiring pitch. A plurality of memory floor plan blocks may be created for different storage capacities or different types.

[Step S4] A floor plan/layout of the clip module block is created. At this time, physical verification of the floor plan/layout of the clip module block is carried out, to thereby create a floor plan/layout that fulfills predetermined rules such as wiring pitch.

[Step S5] Timing verification is carried out with respect to the maximum memory.

[Step S6] The result of the timing verification for the maximum memory is checked, and if there is no problem, the process proceeds to Step S9. If there arises a problem, the process returns to Step S2 to again create floor plans/layouts.

[Step S7] Timing verification is carried out with respect to the minimum memory.

[Step S8] The result of the timing verification for the minimum memory is checked, and if there is no problem, the process proceeds to Step S9. If there arises a problem, the process returns to Step S2 to again create floor plans/layouts.

[Step S9] Design data is created for each of the floor plan blocks.

This completes the generation of design data associated with each of the floor plan blocks.

A manner of how the shape (lateral dimension $X_F$ and vertical dimension $Y_F$) of the fixed block is determined in Step S2 will be now explained in detail.

The shape of the fixed block depends upon the aspect ratio of the configuration of memory that can eventually be mounted. Namely, the shape of the fixed block is determined so that the aspect ratio may fall within the predetermined range whatever the memory configuration may be. Specifically, the shape of the fixed block is adjusted with respect to memory configurations with maximum and minimum aspect ratios, respectively, such that the maximum and minimum aspect ratios fall within the predetermined range.

Figure 4:
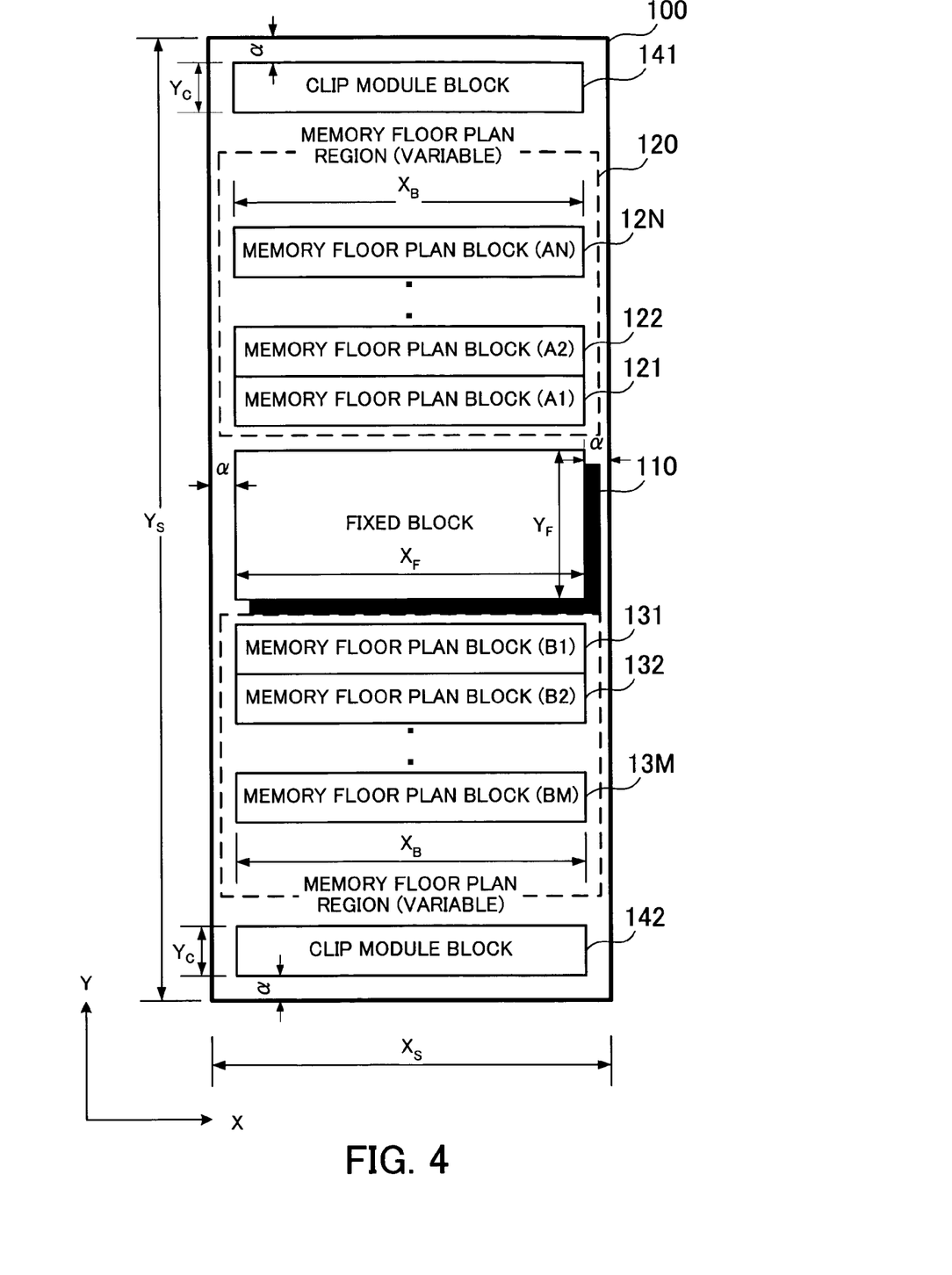
FIG. 4 is a diagram illustrating information used in determining the shape of a fixed block.

FIG. 4 illustrates information used in determining the shape of the fixed block, wherein X and Y axes are taken along the lateral direction and the vertical direction, respectively. The vertical dimension $Y_S$ and lateral dimension $X_S$ of the frame of the CPU macro 100 determine the aspect ratio ($Y_S/X_S$).

The CPU macro 100 is provided with a margin with a width α at its borders. Accordingly, the lateral dimension $X_S$ of the frame of the CPU macro 100 has a value greater by twice the marginal width α than the lateral dimension $X_F$ of the fixed block 110. The memory floor plan blocks 121, 122, . . . , 12N, 131, 132, . . . , 13M and the clip module blocks 141 and 142 have a lateral dimension $X_B$ almost equal to the lateral dimension $X_F$ of the fixed block 110. The clip module blocks 141 and 142 have a vertical dimension of $Y_C$.

The vertical dimension $Y_S$ of the frame of the CPU macro 100 is determined by the number of memories mounted. In the example shown in FIG. 4, N (N is a natural number) memory floor plan blocks 121, 122, . . . , 12N are arranged in the upper memory floor plan region 120, and M (M is a natural number) memory floor plan blocks 131, 132, 13M are arranged in the lower memory floor plan region 130.

In such cases, the shape (lateral dimension $X_F$ and vertical dimension $Y_F$) of the fixed block 110 is determined in the manner indicated below.

$$c \geq (aY_A + Y_F + 2Y_C + 2\alpha)/(X_F + 2\alpha) \quad (1)$$

$$d \leq (bY_B + Y_F + 2Y_C + 2\alpha)/(X_F + 2\alpha) \quad (2)$$

where c and d are the maximum and minimum values of the aspect ratio, respectively, and α is the width of the marginal space and may be a desired value greater than or equal to "0." $Y_A$ represents the length of one memory floor plan block in the Y direction when the memory capacity is at a maximum in compliance with the specification of the CPU macro 100, and $Y_B$ represents the length of one memory floor plan block in the Y direction when the memory capacity is at a minimum in compliance with the specification of the CPU macro 100. Symbol a represents the number of memory floor plan blocks when the memory capacity is at the maximum in compliance with the specification of the CPU macro 100, and b represents the number of memory floor plan blocks when the memory capacity is at the minimum in compliance with the specification of the CPU macro 100.

From among the combinations of the values $X_F$ and $Y_F$ satisfying the expressions (1) and (2) above, a suitable shape is determined. For example, a shape with an aspect ratio closest to "1" is selected.

In the case of a configuration with no clip module blocks like the one shown in FIG. 1, the term "$2Y_C$" in the expressions (1) and (2) is unnecessary.

Once the lateral and vertical dimensions of the fixed block are settled, the shapes of the other floor plan blocks are determined. Then, floor plans/layouts within the individual floor plan blocks are created so as to fit in the respective shapes, and are saved as design data associated with the respective floor plan blocks.

Subsequently, based on the design data associated with the individual floor plan blocks, design data of a CPU macro with a memory configuration complying with an order from the customer is generated.

Figure 5:
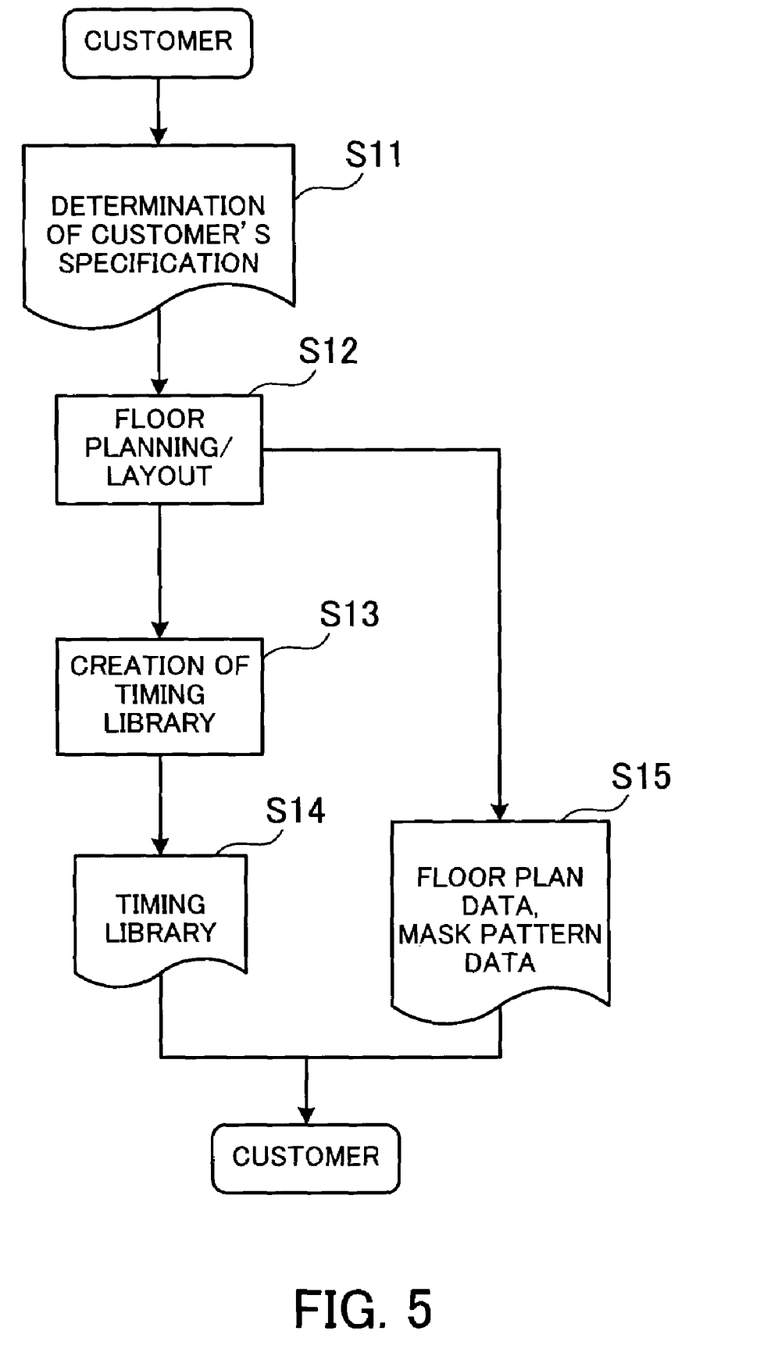
FIG. 5 is a flowchart illustrating a procedure for a process for creating a floor plan in compliance with a customer's order.

FIG. 5 illustrates a procedure for a process for creating a floor plan complying with an order from the customer. In the following, the process shown in FIG. 5 will be explained in order of step number.

[Step S11] The customer's specification is determined. In this embodiment, the memory configuration is determined in compliance with an order from the customer.

[Step S12] The floor plan/layout is determined in compliance with the customer's specification. Specifically, memory floor plan blocks matching the memory configuration are added above and below the fixed block. At this time, a type of memory having a low data input/output speed is arranged close to the fixed block. In the case where ROM is slower than RAM, for example, memory floor plan blocks for ROM are arranged adjacent to the fixed block 110, and then memory floor plan blocks for RAM are arranged adjacent to the memory floor plan blocks for ROM.

[Step S13] A timing library is created. The timing library has registered therein information about the propagation (delay etc.) of signal between component elements (e.g., flip-flops).

[Step S14] The created timing library is delivered to the customer.

[Step S15] Floor plan data and mask pattern data are created and delivered to the customer.

In this manner, the design data of a CPU macro complying with each order from the customer is created and delivered to the customer. When the design data of the individual floor plan blocks is created, not only the physical verification is carried out but the timing verification is performed under the tightest conditions (under conditions wherein signal delay is most likely to occur). It is therefore unnecessary to carry out the timing verification when an order is received from the customer. As a result, the floor plan or layout need not be re-created, whereby design data of a CPU macro complying with the customer's order can be created in a short period of time.

As a method of supplying the design data of the CPU macro, the process shown in FIG. 5 may be executed by a computer to automatically generate the design data. The function of automatically generating design data is hereinafter called CPU macro generator.

For example, design data (Netlist, DEF, LEF, GDS, etc.) of individual floor plan blocks is prepared and stored in a storage device. The customer inputs parameters (memory configuration, technology code) to the CPU macro generator, whereupon the CPU macro generator automatically collects necessary parts and outputs desired design data. In this case, the CPU macro generator may be caused to further calculate the specification of the created CPU macro based on the input parameters.

Figure 6:
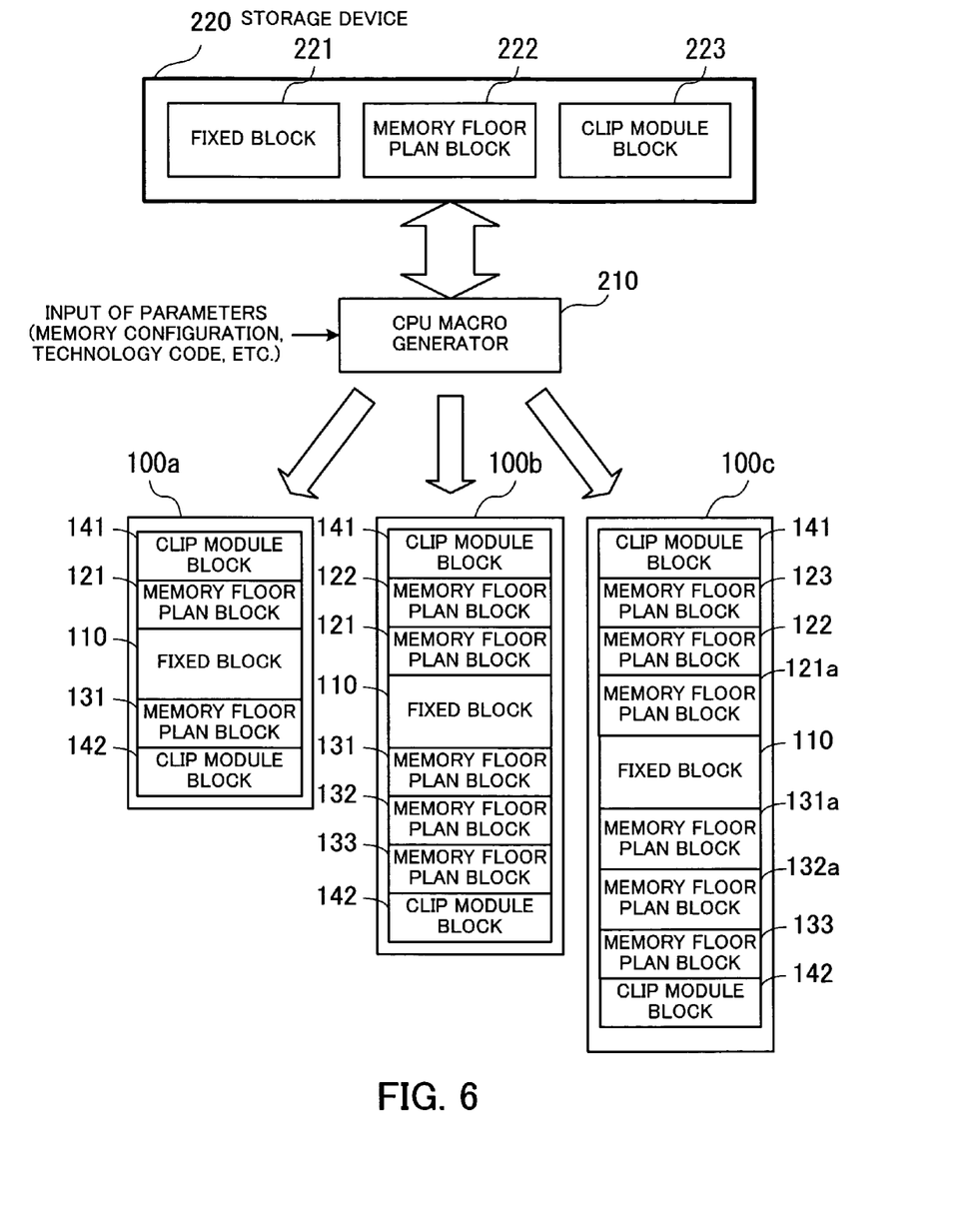
FIG. 6 is a diagram illustrating an example of automatic creation of design data.

FIG. 6 exemplifies such automatic generation of design data. As shown in FIG. 6, design data associated with each of a fixed block 221, memory floor plan block 222 and clip module block 223 is stored beforehand in a storage device 220.

Parameters are input to a CPU macro generator 210. The parameters include, for example, a memory configuration, a technology code, etc. A plurality of parameters that can be input may be prepared in advance, to allow the user to select parameters from among the prepared parameters.

Thereupon, the CPU macro generator 210 collects necessary data from among the design data (LEF, DEF, GDS, etc.) already created for the individual floor plan blocks, and generates design data of the whole CPU macro. For example, if the scale of memory is small (small memory scale), design data for a configuration like that of a CPU macro 100a including two memory floor plan blocks 121 and 131 is generated. If the scale of memory is larger than that of the CPU macro 100a (medium memory scale), design data for a configuration like that of a CPU macro 100b including five memory floor plan blocks 121, 122, 131, 132 and 133 is generated. If the scale of memory is even larger (large memory scale), design data for a configuration like that of a CPU macro 100c including six memory floor plan blocks 121a, 122, 123, 131a, 132a and 133 is generated. The memory floor plan blocks 121a, 131a and 132a are larger in storage capacity than the memory floor plan blocks 121, 131 and 132.

Also, the CPU macro generator 210 accepts the user's input or selection of memory configuration/capacity as parameters, collects necessary data from among the design data (e.g., size and power consumption) prepared in advance for the individual memory floor plan blocks, and outputs design data of the CPU macro 100 (e.g., specification information such as the overall size and power consumption of the CPU macro 100). This makes it possible to reduce the man-hour needed for the estimation of specification and the provision of data.

Figure 7:
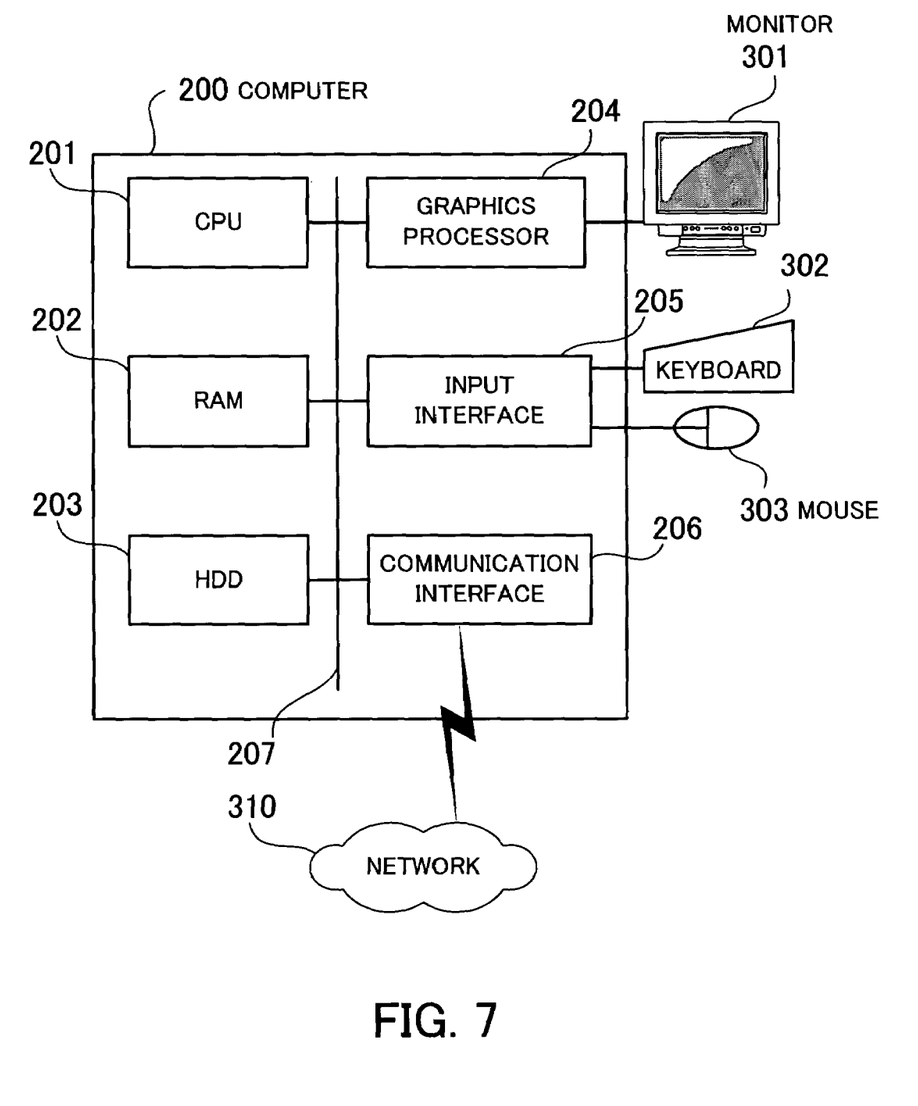
FIG. 7 is a diagram illustrating an exemplary hardware configuration of a computer for performing the function of a CPU macro generator.

FIG. 7 shows an exemplary hardware configuration of a computer for performing the function of the CPU macro generator. The computer 200 is in its entirety under the control of a CPU 201. To the CPU 201 are connected, through a bus 207, a RAM 202, a hard disk drive (HDD) 203, a graphics processor 204, an input interface 205, and a communication interface 206.

The RAM 202 temporarily stores OS (Operating System) programs and at least part of application programs executed by the CPU 201. The RAM 202 also stores various other data necessary for the processing by the CPU 201. The HDD 203 stores the OS and application programs, as well as design data of various floor plan blocks.

The graphics processor 204 is connected to a monitor 301. In accordance with instructions from the CPU 201, the graphics processor 204 causes the monitor 301 to display images on the screen. The input interface 205 is connected to a keyboard 302 and a mouse 303. The input interface 205 sends signals input from the keyboard 302 and the mouse 303 to the CPU 201 through the bus 207.

The communication interface 206 is connected to a network 310 and transmits and receives data to and from other computers through the network 310.

With the hardware configuration described above, the CPU macro generator of this embodiment can be implemented.

As described above, according to the embodiment of the present invention, satisfactory operation can be guaranteed for a memory configuration that is closest to the operating limit in accordance with the specification of the CPU macro, by using the method of creating floor plans having regularity. Also, the floor plan creation method according to this embodiment permits the supply of design data as well as the estimation of macros, whereby the period needed for the development of CPU macros can be shortened.

In the foregoing embodiment, the input signals are fixed at low level by way of input signal clipping, but may alternatively be fixed at high level.

Also, to accomplish the processing function of the CPU macro generator, there is provided a functional block design program in which is described a process for performing the function of the CPU macro generator. The functional block design program is executed by a computer, whereby the processing function of the CPU macro generator is accomplished by the computer. The functional block design program describing the process may be recorded on a computer-readable recording medium. The computer-readable recording medium includes magnetic recording device, optical disc, magneto-optical recording medium, semiconductor memory, etc. Such a magnetic recording device may be hard disk drive (HDD), flexible disk (FD), magnetic tape, etc. As the optical disc, DVD (Digital Versatile Disc), DVD-RAM (Random Access Memory), CD-ROM (Compact Disc Read Only Memory), CD-R (Recordable)/RW (ReWritable) or the like may be used. The magneto-optical recording medium includes MO (Magneto-Optical disc) etc.

To distribute the functional block design program, portable recording media, such as DVD and CD-ROM, on which the program is recorded may be put on sale. Also, the functional block design program may be stored in the storage device of a server computer and may be transferred from the server computer to other computers through a network.

A computer which is to execute the functional block design program stores, in its storage device, the functional block design program recorded on a portable recording medium or transferred from the server computer, for example. The computer loads the functional block design program from its storage device and performs processing in accordance with the functional block design program. Alternatively, the computer may read in the functional block design program directly from the portable recording medium to perform processing in accordance with the functional block design program. Further, as the functional block design program is transferred from the server computer, the computer may sequentially perform processing in accordance with the received program.

As described above, according to the present invention, design data of a functional block in which a desired number of memory blocks corresponding to a desired memory capacity are connected to a fixed block is generated with the use of block-based design data which is verified beforehand in that the constraint on the creation of the functional block is always fulfilled within the limits up to which the memory blocks can be mounted. Accordingly, the generated design data always fulfills the constraint. Consequently, it is unnecessary to verify each of functional blocks with different memory capacities as to the constraint, whereby the period needed for the design of functional blocks can be shortened.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A functional block design method for designing a functional block including a memory, comprising:
    creating block-based design data associated with each of a memory block with a predetermined data storage capacity and a fixed block different from the memory block, in accordance with a predetermined logic design;
    verifying with respect to the created block-based design data that a constraint on creation of the functional block is always fulfilled within limits up to which the memory blocks are concatenated from a position adjacent to the fixed block, the constraint comprising a condition relating to signal delay; and
    generating, with use of the verified block-based design data, design data of a functional block in which a desired number of the memory blocks corresponding to a desired memory capacity are concatenated from a position adjacent to the fixed block.

2. The functional block design method according to claim 1, wherein in the verification as to the constraint, it is judged that the constraint is always fulfilled if it is confirmed that a memory configuration with respect to which the constraint is tightest satisfies the constraint.

3. The functional block design method according to claim 2, wherein in the verification as to the constraint, it is verified whether the constraint is fulfilled or not when the memory blocks are mounted up to an upper limit thereof.

4. The functional block design method according to claim 1, wherein, when the block-based design data is created, shapes of the memory block and the fixed block are determined so that the functional block in which a desired number of the memory blocks are connected within the limits in compliance with a predetermined connection rule may always have a vertical dimension-to-lateral dimension ratio falling within a predetermined range, and
    when the design data of the functional block is generated, the memory blocks are connected to the fixed block in compliance with the predetermined connection rule.

5. The functional block design method according to claim 4, wherein the predetermined connection rule requires that the memory blocks be concatenated from positions adjacent to opposite two sides of the fixed block.

6. The functional block design method according to claim 4, wherein the predetermined connection rule requires that the memory blocks be concatenated in a direction intersecting with adjacent sides of the fixed block and the memory blocks.

7. The functional block design method according to claim 4, wherein the shape of the fixed block is settled by determining a length of a side of the fixed block where the fixed block is connected to the memory blocks.

8. The functional block design method according to claim 4, wherein, when the design data of the functional block is generated, a clip module block for supplying a signal of a predetermined level to an input/output terminal of a terminal one of the memory blocks is connected to the terminal memory block.

9. The functional block design method according to claim 1, wherein, when the block-based design data is created, input/output terminals are provided on each of two opposite sides of the memory block at respective identical distances from a side of the memory block adjacent to the two sides.

10. The functional block design method according to claim 9, wherein an internal circuit for the memory block is designed on precondition that signals of identical types are input to and output from the respective input/output terminals provided on the two opposite sides of the memory block at the respective identical distances from the adjacent side.

11. The functional block design method according to claim 1, wherein the block-based design data associated with the memory block includes a plurality of design data generated with respect to different memory types.

12. The functional block design method according to claim 11, wherein block-based design data associated with read only memory includes wiring for passing a write signal through said read only memory.

13. A functional block design method for automatically designing a functional block including a memory with use of a computer, comprising:
  storing beforehand in a storage device, block-based design data associated with each of a memory block and a fixed block different from the memory block, the block-based design data being verified in that a constraint on creation of the functional block is always fulfilled within limits up to which the memory blocks are concatenated from a position adjacent to the fixed block, the constraint comprising a condition relating to signal delay; and
  generating, in response to an input specifying a memory capacity, design data of a functional block in which a desired number of the memory blocks corresponding to the specified memory capacity are concatenated from a position adjacent to the fixed block, with use of the block-based design data stored in the storage device.

14. A functional block design apparatus for automatically designing a functional block including a memory, comprising:
  a storage device for storing block-based design data associated with each of a memory block and a fixed block different from the memory block, the block-based design data being verified in that a constraint on creation of the functional block is always fulfilled within limits up to which the memory blocks are concatenated from a position adjacent to the fixed block, the constraint comprising a condition relating to signal delay; and
  an arithmetic unit, responsive to an input specifying a memory capacity, for generating, with use of the block-based design data stored in the storage device, design data of a functional block in which a desired number of the memory blocks corresponding to the specified memory capacity are concatenated from a position adjacent to the fixed block.

15. A functional block design program for automatically designing a functional block including a memory,
  wherein the functional block design program causes a computer to perform a process of:
  storing beforehand in a storage device, block-based design data associated with each of a memory block and a fixed block different from the memory block, the block-based design data being verified in that a constraint on creation of the functional block is always fulfilled within limits up to which the memory blocks are concatenated from a position adjacent to the fixed block, the constraint comprising a condition relating to signal delay; and
  generating, in response to an input specifying a memory capacity, design data of a functional block in which a desired number of the memory blocks corresponding to the specified memory capacity are concatenated from a position adjacent to the fixed block, with use of the block-based design data stored in the storage device.

16. A computer-readable recording medium having a functional block design program recorded thereon for automatically designing a functional block including a memory,
  wherein the functional block design program causes the computer to perform a process of:
  storing beforehand in a storage device, block-based design data associated with each of a memory block and a fixed block different from the memory block, the block-based design data being verified in that a constraint on creation of the functional block is always fulfilled within limits up to which the memory blocks are concatenated from a position adjacent to the fixed block, the constraint comprising a condition relating to signal delay; and
  generating, in response to an input specifying a memory capacity, design data of a functional block in which a desired number of the memory blocks corresponding to the specified memory capacity are concatenated from a position adjacent to the fixed block, with use of the block-based design data stored in the storage device.

* * * * *